(12) United States Patent
Taguchi et al.

(10) Patent No.: US 9,598,790 B2
(45) Date of Patent: Mar. 21, 2017

(54) PELLICLE FRAME AND PROCESS FOR MANUFACTURING SAME

(71) Applicant: NIPPON LIGHT METAL COMPANY, LTD., Tokyo (JP)

(72) Inventors: Yoshihiro Taguchi, Shizuoka (JP); Takayuki Yamaguchi, Shizuoka (JP); Shingo Koizumi, Shizuoka (JP); Akira Iizuka, Shizuoka (JP); Kiyokazu Koga, Shizuoka (JP); Masato Yatsukura, Shizuoka (JP)

(73) Assignee: NIPPON LIGHT METAL COMPANY, LTD., Tokyo (JP)

( * ) Notice: Subject to any disclaimer, the term of this patent is extended or adjusted under 35 U.S.C. 154(b) by 0 days.

(21) Appl. No.: 14/649,426

(22) PCT Filed: Nov. 27, 2013

(86) PCT No.: PCT/JP2013/081954
§ 371 (c)(1),
(2) Date: Jun. 3, 2015

(87) PCT Pub. No.: WO2014/087905
PCT Pub. Date: Jun. 12, 2014

(65) Prior Publication Data
US 2015/0316842 A1    Nov. 5, 2015

(30) Foreign Application Priority Data

Dec. 4, 2012  (JP) .................................. 2012-265281

(51) Int. Cl.
*G03F 1/64* (2012.01)
*C22C 21/08* (2006.01)
(Continued)

(52) U.S. Cl.
CPC .............. *C25D 11/06* (2013.01); *C22C 21/08* (2013.01); *C22C 21/10* (2013.01); *C22F 1/047* (2013.01);
(Continued)

(58) Field of Classification Search
None
See application file for complete search history.

(56) References Cited

U.S. PATENT DOCUMENTS 3,917,887 A * 11/1975 Stiller .................. C25D 11/243
148/244
5,759,302 A    6/1998 Nakai et al.
(Continued)

FOREIGN PATENT DOCUMENTS

EP    1 918 427 A1    5/2008
JP    59-126762 A     7/1984
(Continued)

OTHER PUBLICATIONS

Huang, et. al. Applied Surface Science. 283, 2013, 249-257.*
(Continued)

*Primary Examiner* — Vera Katz
(74) *Attorney, Agent, or Firm* — Birch, Stewart, Kolasch & Birch, LLP

(57) ABSTRACT

Provided is a pellicle frame that can prevent generation of haze and reduces a surface glittering defect under irradiation with collected light, and a method of manufacturing the same. The pellicle frame is obtained by using an aluminum frame material having a structure satisfying predetermined conditions on the circle-equivalent diameters of a $Mg_2Si$ crystallized product, an AlCuMg crystallized product, an Al—Fe-based crystallized product ($Al_mFe$ or $Al_7Cu_2Fe$), and an $Al_2CuMg$ crystallized product and on the area ratios of those crystallized products each having a circle-equiva-
(Continued)

lent diameter of 1 μm or more, and in addition, subjecting the aluminum frame material to anodic oxidation processing using an alkaline electrolytic solution containing as an electrolyte a predetermined organic acid salt. In addition, the method of manufacturing a pellicle frame includes: preparing an aluminum frame material having a structure as described above; and subjecting the aluminum frame material to anodic oxidation processing using an alkaline electrolytic solution containing a predetermined organic acid salt, to form an anodic oxide film.

3 Claims, 2 Drawing Sheets

(51) Int. Cl.
    *C22F 1/047*      (2006.01)
    *C25D 11/04*      (2006.01)
    *C25D 11/06*      (2006.01)
    *C22C 21/10*      (2006.01)
    *C25D 11/10*      (2006.01)
    *C22F 1/00*      (2006.01)

(52) U.S. Cl.
    CPC .............. C25D 11/04 (2013.01); C25D 11/10 (2013.01); G03F 1/64 (2013.01); C22F 1/00 (2013.01); Y10T 428/257 (2015.01)

(56) References Cited

U.S. PATENT DOCUMENTS 5,855,697 A * 1/1999 Luo ........................... C22C 1/02
                                                                                                  148/420
9,057,143 B2 * 6/2015 Kita ........................ C22C 21/06

2005/0016638 A1 * 1/2005 Kondoh .............. C22C 32/0078
                                                                       148/420
2005/0016640 A1 * 1/2005 Valentinovich ...... B22D 21/007
                                                                       148/538
2006/0099788 A1 * 5/2006 Davison .................. H01L 24/81
                                                                       438/597
2006/0141209 A1      6/2006 Nagata
2010/0018025 A1 * 1/2010 Naritomi ........... B29C 45/14778
                                                                        29/458
2012/0122025 A1      5/2012 Murakami et al.
2012/0171427 A1 * 7/2012 Kita ....................... C25D 11/16
                                                                       428/156

FOREIGN PATENT DOCUMENTS

| JP | 8-283892 A | 10/1996 | |
|---|---|---|---|
| JP | 2001-279359 A | 10/2001 | |
| JP | 2009-3111 A | 1/2009 | |
| JP | 2010-146027 A | 7/2010 | |
| JP | 2010-237282 A | 10/2010 | |
| JP | 2012-159671 A | 8/2012 | |
| JP | 2013-7762 A | 1/2013 | |
| WO | WO 2011030850 A1 * | 3/2011 | ............. C22C 21/06 |

OTHER PUBLICATIONS

International Search Report, issued in PCT/JP2013/081954, dated Jan. 28, 2014.
An International Preliminary Report on Patentability and an English translation of the Written Opinion of the International Searching Authority, dated Jun. 18, 2015, issued in the corresponding International Application No. PCT/JP2013/081954.
European Search Report, dated Aug. 5, 2016, for European Application No. 13860783.3.

* cited by examiner

FIG. 2A ALUMINUM FRAME MATERIAL iii
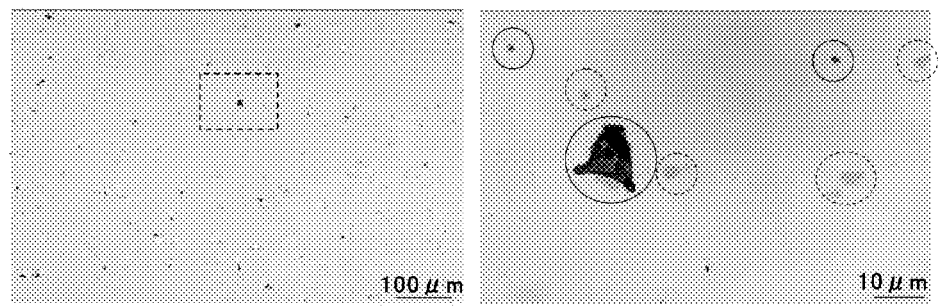
FIG. 2B ALUMINUM FRAME MATERIAL i
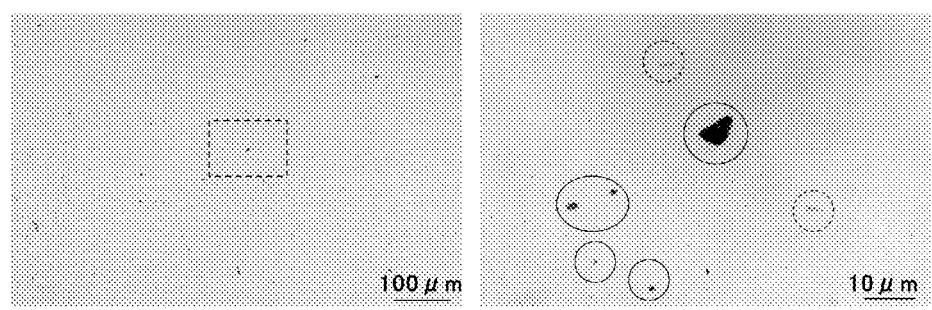
FIG. 2C ALUMINUM FRAME MATERIAL ii
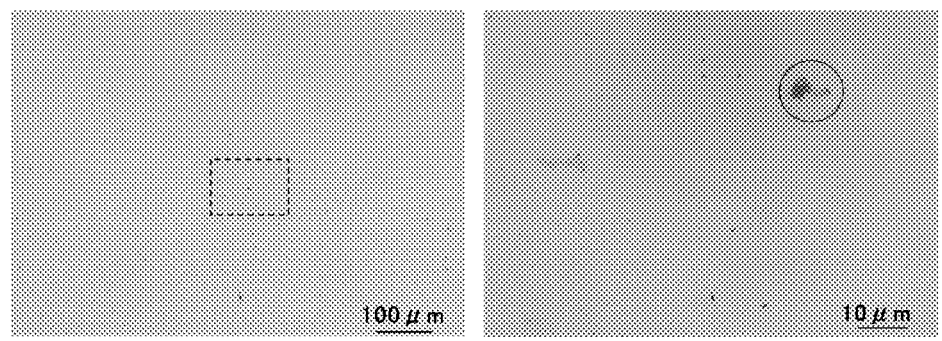

PELLICLE FRAME AND PROCESS FOR MANUFACTURING SAME

TECHNICAL FIELD

The present invention relates to a pellicle frame of a pellicle device to be used for, for example, transferring a circuit pattern of an IC or an LSI on a semiconductor substrate, and to a method of manufacturing the same. More particularly, the present invention relates to a pellicle frame that can prevent generation of haze and reduces a surface glittering defect under irradiation with collected light, and to a method of manufacturing the same.

BACKGROUND ART

A pellicle device is obtained by bonding a transparent optical thin film (pellicle film) to a pellicle frame having a shape corresponding to that of a photomask or a reticle, while expanding the film. The pellicle device prevents foreign materials from directly adhering onto the photomask or the reticle. In addition, even when the foreign materials adhere onto the pellicle film, such foreign materials do not form images on a semiconductor substrate or the like. Therefore, it is possible to accurately transfer a circuit pattern, and thus improve a manufacturing yield in a photolithography step.

In recent years, along with high integration of a semiconductor device or the like, a circuit pattern has been required to be drawn more finely with a lower line width, and a mainstream exposure light source to be used in the photolithography step has employed a short-wavelength light. The light source employing such short-wavelength light has a high output power and high light energy. Therefore, when an inorganic acid such as sulfuric acid or phosphoric acid remains in an anodic oxide film on a surface of an aluminum frame material for forming the pellicle frame, there arises a problem in that such inorganic acid reacts with a basic substance such as ammonia present in an exposure atmosphere to generate a reaction product such as ammonium sulfate, and the reaction product (haze) causes fogging and affects a transferred image.

In view of the foregoing, there has been proposed a pellicle frame that is obtained by forming an anodic oxide film on a surface of an aluminum frame material through anodic oxidation processing using an electrolytic solution containing tartaric acid or a salt thereof, and thus reduces an amount of an inorganic acid such as sulfuric acid or phosphoric acid and suppresses generation of haze as much as possible even under irradiation with high-energy light (see Patent Literature 1).

Meanwhile, it is necessary to strictly control particles in a manufacturing process of the semiconductor device or the like, and also the pellicle device is generally confirmed for the presence or absence of dust by visual observation or with an inspection device. At this time, there is a problem in that a film defect visually observed as a white spot on a surface of the pellicle frame is confusable with fine dust, and thus an inspection operation is disturbed.

There has been reported that, on the assumption that such film defect visually observed as a white spot is caused by a crystallized product contained in a metal structure forming the aluminum frame material being corroded with a dye solution in dyeing of the anodic oxide film in black and dropped out from the anodic oxide film, dye missing or generation of a white spot can be reduced by specifying a component composition of a JIS 7075 aluminum alloy for forming the aluminum frame material and further shaking the aluminum frame material in the dye solution at the time of dyeing of the aluminum frame material with a black-based dye after anodic oxidation processing (see Patent Literature 2).

However, the thinning of the circuit pattern in the semiconductor device or the like as described above has increasingly progressed, and along with this, inspection standards for the pellicle device have become stricter. Therefore, a white spot involving light reflection in visual inspection not only under irradiation with fluorescent light but also under irradiation with collected light, that is, a surface glittering defect of the pellicle frame under irradiation with collected light is required to be reduced because such defect may be falsely recognized as dust.

CITATION LIST

Patent Literature

[PTL 1] JP 2010-237282 A
[PTL 2] JP 3777987 B2

SUMMARY OF INVENTION

Technical Problem

In such circumstances, there arises a new problem in that, in the case where the anodic oxide film is formed by using an alkaline electrolytic solution containing as an electrolyte a salt of an organic acid such as a dicarboxylic acid or a tricarboxylic acid without using sulfuric acid in order to prevent generation of haze, the surface glittering defect under irradiation with collected light is difficult to reduce. The inventors of the present invention have diligently investigated the cause of the problem, and have found that there is such a defect that the crystallized product contained in the aluminum frame material glitters in itself under irradiation with collected light, unlike the film defect visually observed as a white spot as investigated in Patent Literature 2, which is caused by the crystallized product being corroded with the dye solution in a dyeing step after the anodic oxidation processing and dropped out from the film. It has been found out that, of those crystallized products, a $Mg_2Si$ crystallized product is the main cause of the glittering, and also an AlCuMg crystallized product, an Al—Fe-based crystallized product ($Al_mFe$ or $Al_7Cu_2Fe$), and an $Al_2CuMg$ crystallized product cause the glittering.

In view of the foregoing, the inventors have further improved the aluminum frame material disclosed in Patent Literature 2, and have found that the glittering under irradiation with collected light due to the specific crystallized products remaining in the film, such as the $Mg_2Si$ crystallized product, can be reduced even when the anodic oxide film is formed by using the alkaline electrolytic solution containing as an electrolyte an organic acid salt as described above by allowing an Al—Zn—Mg-based aluminum alloy for forming the aluminum frame material to satisfy the JIS A7075 standard and have a component composition that has the contents of Mg, Cu, Cr, Fe, and Si restricted. Thus, the present invention has been completed.

Accordingly, an object of the present invention is to provide a pellicle frame that can prevent generation of haze and reduces a surface glittering defect under irradiation with collected light.

In addition, another object of the present invention is to provide a method of manufacturing a pellicle frame that can prevent generation of haze and reduce a surface glittering defect under irradiation with collected light.

Solution to Problem

That is, according to one embodiment of the present invention, there is provided a pellicle frame, including an aluminum frame material, which is formed of an Al—Zn—Mg-based aluminum alloy, and has an anodic oxide film on a surface thereof, in which: the aluminum frame material has a structure, in which a $Mg_2Si$ crystallized product has a circle-equivalent diameter of 7 μm or less, an area ratio of a $Mg_2Si$ crystallized product having a circle-equivalent diameter of 1 μm or more is less than 0.10%, an AlCuMg crystallized product, an Al—Fe-based crystallized product, and an $Al_2CuMg$ crystallized product each have a circle-equivalent diameter of 9 μm or less, and a total area ratio of an AlCuMg crystallized product, an Al—Fe-based crystallized product, and an $Al_2CuMg$ crystallized product each having a circle-equivalent diameter of 1 μm or more is less than 0.20%; and the anodic oxide film is obtained through anodic oxidation processing using an alkaline electrolytic solution containing as an electrolyte any one kind or two or more kinds selected from the group consisting of dicarboxylic acid salts and tricarboxylic acid salts.

According to another embodiment of the present invention, there is provided a method of manufacturing a pellicle frame including: an aluminum frame material formed of an Al—Zn—Mg-based aluminum alloy; and an anodic oxide film on a surface of the aluminum frame material, the method including: subjecting a DC cast billet satisfying a JIS A7075 standard and having a component composition that has a Mg content restricted to 2.6 mass % or less, has a Cu content restricted to 1.6 mass % or less, has a Cr content restricted to 0.28 mass % or less, has an Fe content restricted to 0.07 mass % or less, and has a Si content restricted to 0.04 mass % or less to homogenization processing including heating and retaining the DC cast billet at a temperature of 460° C. or more for 12 hr or more; extruding the DC cast billet to obtain an aluminum extruded profile; cutting out an aluminum frame material having a predetermined shape from the aluminum extruded profile; subjecting the aluminum frame material to anodic oxidation processing using an alkaline electrolytic solution containing as an electrolyte any one kind or two or more kinds selected from the group consisting of dicarboxylic acid salts and tricarboxylic acid salts, to form an anodic oxide film.

In the present invention, an Al—Zn—Mg-based aluminum alloy is used for the aluminum frame material for forming the pellicle frame. The Al—Zn—Mg-based aluminum alloy has the highest strength of aluminum alloys, and is suitable for obtaining the pellicle frame by virtue of realizing high dimensional accuracy, being capable of preventing deformation or flaws due to an external force during use, and the like.

A typical example of such Al—Zn—Mg-based aluminum alloy is an A7075 aluminum alloy specified by JIS. In the present invention, by further specifying the component composition of the alloy satisfying the JIS A7075 standard, the aluminum frame material having a structure, in which a $Mg_2Si$ crystallized product has a circle-equivalent diameter of 7 μm or less, preferably 4 μm or less, the area ratio of a $Mg_2Si$ crystallized product having a circle-equivalent diameter of 1 μm or more is less than 0.10%, preferably less than 0.05%, an AlCuMg crystallized product, an Al—Fe-based crystallized product of an $Al_mFe$ (3≤m≤6) crystallized product or an $Al_7Cu_2Fe$ crystallized product, and an $Al_2CuMg$ crystallized product each have a circle-equivalent diameter of 9 μm or less, preferably 6 μm or less, and the total area ratio of an AlCuMg crystallized product, an Al—Fe-based crystallized product ($Al_mFe$ or $Al_7Cu_2Fe$), and an $Al_2CuMg$ crystallized product each having a circle-equivalent diameter of 1 μm or more is less than 0.20%, preferably less than 0.1%, is used.

Herein, the circle-equivalent diameter of each of the crystallized products refers to a diameter of a circle having the same area as that of each of the crystallized products present on a cut surface of the aluminum frame material as a surface to be measured. In addition, the area ratio of each of the crystallized products refers to the area ratio of each of the crystallized products determined through image analysis of the surface to be measured. The crystallized products may each be identified by X-ray diffraction, and in addition, the $Mg_2Si$ crystallized product may be identified by using an etching solution such as a sodium hydroxide solution or hydrofluoric acid (see, for example, "Structure and Property of Aluminum," edited by 40th Anniversary Commemorative Events Executive Committee, Editing Group Meeting, The Japan Institute of Light Metals, 1991, p. 15).

That is, in the present invention, the aluminum frame material is formed of the Al—Zn—Mg-based aluminum alloy satisfying the JIS A7075 standard and having a component composition that includes 2.6 mass % or less of Mg, 1.6 mass % or less of Cu, 0.28 mass % or less of Cr, 0.07 mass % or less of Fe, and 0.04 mass % or less of Si. Now, just for reference, Table 1 shows chemical components of the A7075 aluminum alloy specified by JIS (referring to "Aluminum Handbook", edited by Aluminum Handbook Editing Committee, the Old Light Metal Rolling Committee, the Japan Light Metal Association, 1978, Table 2.1 in p. 13).

TABLE 1

| Kind (JIS desig- nation) | Chemical component (%) | | | | | | | | |
| --- | --- | --- | --- | --- | --- | --- | --- | --- | --- |
| | Si | Fe | Cu | Mn | Mg | Zn | Cr | Ti | Zr + Ti | Al |
| 7075 | 0.40 | 0.5 | 1.2 to 2.0 | 0.30 | 2.1 to 2.9 | 5.1 to 6.1 | 0.18 to 0.35 | — | 0.25 | Balance |

Note:
A numerical value not representing a range of values represents a maximum value.

When Mg and Si are each contained at a content exceeding the above-mentioned range, the amount of $Mg_2Si$ is increased in the aluminum frame material, and hence the condition that the $Mg_2Si$ crystallized product has a circle-equivalent diameter of 7 μm or less and the condition that the area ratio of the $Mg_2Si$ crystallized product having a circle-equivalent diameter of 1 μm or more is less than 0.10% cannot be satisfied at the same time. $Mg_2Si$ in question is generally dissolved through anodic oxidation processing using sulfuric acid bath electrolysis (see, for example, "The Fundamentals of Aluminum Materials and Industrial Technology," edited by Fundamentals of Aluminum Materials and Industrial Technology Editing Committee, the Japan Light Metal Association, 1985, p. 226), and hence it is expected that $Mg_2Si$ does not cause the surface glittering defect under irradiation with collected light in the invention disclosed in Patent Literature 2. In contrast, in the present invention, the component composition of the A7075 aluminum alloy specified by JIS is further specified as described above and thereby the circle-equivalent diameter and area ratio of the $Mg_2Si$ crystallized product are controlled, because $Mg_2Si$ is difficult to dissolve with the alkaline electrolytic solution (see, for example, "Structure and Property of Aluminum," edited by 40th Anniversary Commemorative Events Executive Committee, Editing Group Meeting, The Japan Institute of Light Metals, 1991, p. 15).

Similarly, when Cu and Fe are each contained at a content exceeding the above-mentioned range, the amount of an Al—Cu—Fe-based compound, an Al—Cu—Mg-based compound, or the like is increased. The crystallized products of those compounds also cause the surface glittering defect of the pellicle frame under irradiation with collected light, and hence the contents of Cu and Fe need to be controlled in the component composition. Specifically, it is considered that the cause of the glittering under irradiation with collected light in the case of the general A7075 aluminum alloy specified by JIS in the related art is a coarse crystallized grain having a maximum length of about 20 µm and a relatively fine crystallized grain having a maximum length of about 10 µm. Of those, the coarse crystallized grain corresponds to the $Mg_2Si$ crystallized product, and the relatively fine crystallized grain includes the AlCuMg crystallized product, the Al—Fe-based crystallized product ($Al_mFe$ or $Al_7Cu_2Fe$), and the $Al_2CuMg$ crystallized product, in addition to the $Mg_2Si$ crystallized product ($Mg_2Si$ is observed in both the relatively coarse crystallized grain and fine crystallized grain). In view of the foregoing, also the contents of Cu and Fe need to be controlled in order to reduce the amounts of the Al—Cu—Fe-based compound and Al—Cu—Mg-based compound.

Further, Cr is a component for achieving a fine fibrous structure in the extrusion of a DC cast billet, preventing growth of recrystallized grains in solution heat processing, and substantially imparting strength by virtue of the fibrous structure even when a recrystallized structure is partly generated. When the content of Cr is less than the lower limit value, the effects are less exhibited. When the content of Cr exceeds the upper limit value, the coarse crystallized grain is generated, resulting in a risk of a white spot defect in dyeing after the anodic oxidation processing, and a reduction in extrusion property.

In the present invention, the aluminum frame material may be obtained by: subjecting a DC cast billet having the above-mentioned chemical component composition to homogenization processing including heating and retaining the DC cast billet at a temperature of 460° C. or more for 12 hr or more in total; extruding the DC cast billet to obtain an aluminum extruded profile; and cutting out the aluminum frame material having a predetermined shape therefrom. In casting, a DC casting method is preferred because a molten metal is rapidly cooled and the crystallized products are crystallized out in a small size. A molten metal having an alloy composition is produced by, for example, adding an alloy element directly as a metal to molten Al, or adding as a mother alloy. Then, after degassing processing, the molten metal is allowed to pass through a filter as required, and cast into a billet.

In addition, in the homogenization processing, the DC cast billet is not necessarily retained at a constant temperature. The DC cast billet may be retained so that a heating time period at a temperature of 460° C. or more is 12 hr or more in total, by, for example, being retained at 460° C. for 2 hr, followed by being retained at 470° C. for 10 hr. Herein, from the viewpoint of more reliably controlling the circle-equivalent diameters and area ratios of the $Mg_2Si$ crystallized product, the AlCuMg crystallized product, the Al—Fe-based crystallized product ($Al_mFe$ or $Al_7Cu_2Fe$), and the $Al_2CuMg$ crystallized product, it is preferred to perform: first homogenization processing including heating and retaining the DC cast billet at a temperature of 460° C. or more for 12 hr or more in total; and second homogenization processing including retaining the DC cast billet at a temperature higher than the temperature of the first homogenization processing for 1 hr or more in total. That is, when the heating and retaining of 460° C.×2 hr+470° C.×10 hr in the case of the above-mentioned example is performed as the first homogenization processing, heating and retaining of 480° C.×10 hr+500° C.×10 hr is performed as the second homogenization processing, for example. At this time, the second homogenization processing preferably includes a step of heating and retaining the DC cast billet at a temperature of 500° C. or more for 1 hr or more, because $Mg_2Si$ becomes a solid solution when heated up to 500° C. It should be noted that the upper limit of the heating temperature of the homogenization processing is substantially 600° C. in consideration of elution of aluminum serving as a mother material, and the like. In addition, the upper limits of the time periods of the first and the second homogenization processing are each 40 hr in consideration of the effects being saturated, economic efficiency, and the like.

After the homogenization processing, the DC cast billet is extruded to obtain the hollow aluminum extruded profile having dimensions corresponding to those of the pellicle frame. The aluminum extruded profile may be subjected to solution quenching processing, or further to aging hardening processing. Of those processes, the solution quenching processing is performed for exhibiting strength in the subsequent processing, and is generally performed by, for example, heating the aluminum extruded profile at a temperature up to about 480° C. and retaining the aluminum extruded profile for about from 0.5 to 5 hr. In addition, the quenching processing is performed for exhibiting strength in the subsequent processing by rapidly cooling the aluminum extruded profile subjected to processing at high temperature and in the state of a solid solution and converting the aluminum extruded profile in the state of a supersaturated solid solution at room temperature. Further, the aging hardening processing is performed for imparting strength by allowing aging precipitation of a compound containing the alloy element. It is desired that the aging processing preferably conform to the tempering conditions described in JIS H0001, most preferably be processing for achieving a material of temper designation T651.

In the present invention, the aluminum frame material having a predetermined shape is cut out from the obtained aluminum extruded profile, and then subjected to the anodic oxidation processing using an alkaline electrolytic solution containing as an electrolyte a dicarboxylic acid salt and/or a tricarboxylic acid salt, to form the anodic oxide film on the surface of the aluminum frame material. The organic acid salt as described above may be any salt as long as it is a water-soluble organic acid salt, and examples of the salt include an oxalate, a malonate, a succinate, a glutarate, an adipate, a tartrate, a citrate, and a maleate. Of those, for example, in the case of using a tartrate, a tartrate such as sodium tartrate, potassium tartrate, sodium potassium tartrate, or ammonium tartrate may be suitably used, and the same salt may be suitably used also for other dicarboxylates or tricarboxylates. It should be noted that the alkaline electrolytic solution only needs to contain as an electrolyte at least one kind of the dicarboxylic acid salts and tricarboxylic acid salts described above. In addition, the alkaline electrolytic solution may contain as an electrolyte two or more kinds thereof.

The processing conditions such as the pH of the electrolytic solution containing as an electrolyte a dicarboxylic acid salt and/or a tricarboxylic acid salt, the concentration of the dicarboxylic acid salt and/or tricarboxylic acid salt in the electrolytic solution, a bath temperature, a voltage and electrical quantity of the anodic oxidation processing, and the like each vary depending on the kind of the dicarboxylic acid salt and/or tricarboxylic acid salt to be used and the like, and hence it is difficult to specify the conditions in a word. Therefore, the processing conditions are described taking as an example the case of using a tartrate.

Specifically, the concentration of the tartrate is desirably from 13 to 200 g/L, preferably from 25 to 150 g/L. When the concentration is less than 13 g/L, the anodic oxide film is hardly formed. In contrast, when the concentration exceeds 200 g/L, there is a risk in that the tartrate precipitates in anodic oxidation at low temperature. In addition, the pH is desirably from 12.25 to 13.25, preferably from 12.5 to 13.0. When the pH is less than 12.25, the generation speed of the film tends to be reduced. In contrast, when the pH exceeds 13.25, the dissolution speed of the film is increased, dusting or the like may occur. In addition, the bath temperature is desirably from 0 to 15° C., preferably from 5 to 10° C. When the bath temperature is less than 0° C., the generation speed of the film is reduced, and the processing becomes inefficient. In contrast, when the bath temperature exceeds 15° C., the dissolution speed of the film is increased to prolong the time period for forming the film, and dusting or the like may occur. Further, the voltage of the anodic oxidation processing is desirably from 10 to 60 V, preferably from 20 to 40 V. When the voltage is less than 10 V, the film may be weakened. In contrast, when the voltage exceeds 60 V, the area of pores is reduced, and it becomes difficult to sufficiently blacken the anodic oxide film in subsequent dyeing with a black dye or the like.

In addition, as described above, the $Mg_2Si$ crystallized product is difficult to dissolve with the alkaline electrolytic solution, but the AlCuMg crystallized product, the Al—Fe-based crystallized product ($Al_mFe$ or $Al_7Cu_2Fe$), and the $Al_2CuMg$ crystallized product are each considered to be dissolved in the alkaline electrolytic solution in a slight amount. Therefore, those crystallized products remaining in the anodic oxide film and causing the glittering can also be reduced in size by reducing the speed of the anodic oxidation. The speed of the anodic oxidation processing may be changed by the amount of dissolved aluminum (Al) even when the concentration of an alkali is constant in the electrolytic solution, and as the amount of dissolved Al becomes larger, the speed of the anodic oxidation becomes lower. In this context, it is desired to control the amount of dissolved Al within a range of preferably from 0.2 to 0.4 g/L at the time of the anodic oxidation processing.

After the anodic oxidation processing, the anodic oxide film is desirably blackened for the purposes of, for example, preventing scattering of exposure light and facilitating a foreign material adhesion test before use. For blackening processing, any known method may be employed, and examples of the processing include processing using a black dye and electrolytic deposition processing (secondary electrolysis). A preferred example thereof is dyeing processing using a black dye, and a more preferred example thereof is dyeing processing using an organic black dye. In general, an organic dye is considered to contain an acid component at a small content. Of the organic dyes, an organic dye containing sulfuric acid, acetic acid, and formic acidat small contents is most preferably used. As such organic dye, there may be given, for example, commercially available products "TAC411", "TAC413", "TAC415", and "TAC420" (all the products are manufactured by Okuno Chemical Industries Co., Ltd). It is desired that the aluminum frame material after the anodic oxidation processing be immersed in a dye solution prepared to achieve a predetermined concentration, and subjected to dyeing processing under the processing conditions of a processing temperature of from 40 to 60° C. and a pH of from 5 to 6 for about 10 min.

In addition, after the blackening, the anodic oxide film is desirably subjected to sealing processing. The sealing processing is not particularly limited, and any known method such as one using steam or sealing bath may be adopted. Of those methods, sealing processing using steam is desired from the viewpoint of sealing an acid component while eliminating a risk of contamination with impurities. The conditions of the sealing processing using steam may be as follows: for example, a temperature of from 105 to 130° C.; a relative humidity of from 90 to 100% (R.H.); a pressure of from 0.4 to 2.0 $kg/cm^2G$; and a processing time period of from 12 to 60 min. In addition, after the sealing processing, washing with pure water or the like is desirably performed.

Further, in the present invention, the surface of the aluminum frame material may be subjected to roughening processing by mechanical means such as blast processing or chemical means using an etching solution, prior to the anodic oxidation processing. A low reflective black pellicle frame like a matted one is obtained by preliminarily performing such roughening processing.

The pellicle frame of the present invention can reduce the surface glittering defect under irradiation with collected light even when the anodic oxide film is formed by using the alkaline electrolytic solution containing as an electrolyte the predetermined organic acid salt by restricting the component composition of the Al—Zn—Mg-based aluminum alloy and thus using the aluminum frame material having a structure satisfying the predetermined conditions on the circle-equivalent diameters of the crystallized products such as the $Mg_2Si$ crystallized product and on the area ratios of the crystallized products each having a circle-equivalent diameter of 1 µm or more in the crystallized products. In addition, the pellicle frame of the present invention can exhibit the following characteristics in an ion elution test for measuring the concentrations of ions eluted after immersion in pure water at 80° C. for 4 hr.

Specifically, the concentration of a sulfate ion ($SO_4^{2-}$), which is an ion having the largest influence on the generation of haze, is 0.01 ppm or less, preferably less than 0.005 ppm (quantitative limit), in terms of concentration to be eluted in 100 ml of pure water per 100 $cm^2$ of the surface area of the pellicle frame. By controlling the elution amount of a sulfate ion, the generation of haze can be reduced as much as possible. It should be noted that the detection of the ion to be eluted may be performed by ion chromatography analysis. The detailed measurement conditions are described in Examples.

The pellicle frame of the present invention may be used as a pellicle device after bonding onto one surface thereof an optical thin film (pellicle film) formed of an inorganic substance such as quartz or of a polymer film of nitrocellulose, polyethylene terephthalate, a cellulose ester, polycarbonate, polymethyl methacrylate, or the like, while extending the film, and in addition, providing a pressure-sensitive adhesive body for fixing the pellicle device onto a photomask or reticle on the end surface of the pellicle frame opposite to the surface on which the optical thin film is provided. In addition, the optical thin film may include an antireflection film formed of an inorganic substance such as $CaF_2$ or a polymer such as polystyrene and Teflon (trademark).

Advantageous Effects of Invention

According to the embodiments of the present invention, the generation of haze can be suppressed as much as possible by forming the anodic oxide film by using the alkaline electrolytic solution containing as an electrolyte the predetermined organic acid salt. In addition, the surface glittering defect under irradiation with collected light can be reduced by focusing attention on the $Mg_2Si$ crystallized product, the AlCuMg crystallized product, the Al—Fe-based crystallized product ($Al_mFe$ or $Al_7Cu_2Fe$), and the $Al_2CuMg$ crystallized product, and using the aluminum frame material in which the circle-equivalent diameters of those crystallized products and their area ratios in the structure are specified.

BRIEF DESCRIPTION OF DRAWINGS

FIGS. 2A, 2B and 2C are optical micrographs of cut surfaces of aluminum frame materials used in Examples.

DESCRIPTION OF EMBODIMENTS

Preferred embodiments of the present invention are hereinafter described on the basis of Examples and Comparative Examples.

EXAMPLES

Production of Aluminum Frame Material i

Figure 1A:
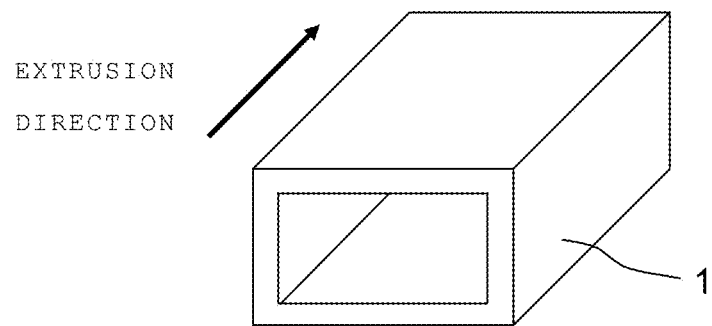
FIGS. 1A and 1B are schematic views for illustrating a hollow extruded profile and an aluminum frame material cut out therefrom produced in Examples.
Figure 1B:
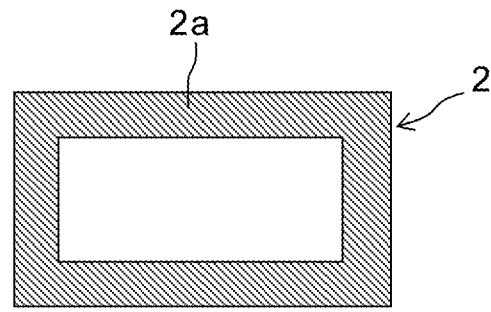

A billet was produced by a DC casting method so as to achieve an alloy composition A shown in Table 2. The billet was subjected to homogenization processing including: heating and retaining the billet at 460° C. for 2 hr; increasing the temperature at a rate of 100° C./hr; and heating and retaining the billet at 470° C. for 10 hr, in the atmosphere. Next, the billet after the homogenization processing was cut into a predetermined length, and then extruded to obtain a hollow extruded profile 1 having a rectangle shape illustrated in FIGS. 1A and 1B. Then, the hollow extruded profile 1 was subjected to artificial aging hardening processing under the tempering conditions T651 described in JIS H0001. The hollow extruded profile 1 was cut in a direction perpendicular to an extrusion direction (cut along a cross section) and machined, to produce 50 pieces of aluminum frame materials i in total each having a frame shape and measuring, as external dimensions, 149 mm×122 mm×5.8 mm in thickness.

Production of Aluminum Frame Material ii

A total of 50 pieces of aluminum frame materials ii were produced in the same manner as in the case of the aluminum frame materials i except that the billet was further subjected to homogenization processing including: increasing the temperature to 480° C. at a rate of 100° C./hr; heating and retaining the billet at 480° C. for 10 hr; then increasing the temperature at a rate of 100° C./hr; and heating and retaining the billet at 500° C. for 10 hr, in addition to the homogenization processing as in the case of the aluminum frame materials i.

Production of Aluminum Frame Material iii

A billet was produced by a DC casting method so as to achieve an alloy composition B shown in Table 2. Then, a total of 50 pieces of aluminum frame materials iii were produced in the same manner as in the case of the aluminum frame materials i.

TABLE 2

| Alloy composition | Si | Fe | Cu | Ti | Mn | Cr | Zn | Mg | (Unit: mass %) Al and other impurities |
|---|---|---|---|---|---|---|---|---|---|
| A | 0.019 | 0.018 | 1.31 | 0.041 | 0.002 | 0.216 | 5.29 | 2.28 | Balance |
| B | 0.050 | 0.084 | 1.63 | 0.039 | 0.009 | 0.228 | 5.52 | 2.59 | Balance |

One aluminum frame material was sampled from each of the obtained aluminum frame materials i to iii, and the cut surfaces (surfaces perpendicular to the extrusion direction of the hollow extruded profile 1) of the aluminum frame materials were each photographed with an optical microscope. Then, an observation field of $9.96 \times 10^5$ $\mu m^2$ was arbitrarily selected from the photographed image, and the circle-equivalent diameters of crystallized products and the areas of the crystallized products each having a circle-equivalent diameter of 1 µm or more were measured in the observation field with an image analyzer (Luzex).

Herein, FIG. 2A shows a photograph of the cut surface of the aluminum frame material iii. In the photograph, an area coming out relatively dense corresponds to a $Mg_2Si$ crystallized product (an area surrounded by a solid-line circle), and the largest one has a maximum length of about 20 µm. In contrast, an area coming out lighter than the $Mg_2Si$ crystallized product corresponds to crystallized products other than the $Mg_2Si$ crystallized product (an area surrounded by a broken-line circle). On the other hand, FIG. 2B shows a photograph of the cut surface of the aluminum frame material i. FIG. 2B shows that all the crystallized products are fine and reduced in number as compared to those in the case of the aluminum frame material iii. In addition, FIG. 2C shows a photograph of the cut surface of the aluminum frame material ii. FIG. 2C shows that all the crystallized products are further fine and reduced in number as compared to those in the case of the aluminum frame materials i and iii. In addition, the crystallized products other than the $Mg_2Si$ crystallized product observed in the cut surfaces of the aluminum frame materials i and iii were identified for their component composition by X-ray analysis. As a result, the crystallized products were found to be an AlCuMg crystallized product, an Al—Fe-based crystallized product ($Al_mFe$ ($3 \leq m \leq 6$) or $Al_7Cu_2Fe$), and an $Al_2CuMg$ crystallized product as shown in Table 3. It should be noted that the $Mg_2Si$ crystallized product was confirmed to be $Mg_2Si$ by etching using hydrofluoric acid. In addition, in each of FIGS. 2A to 2C, a quadrangular area surrounded by a broken line shown in a photograph on the reader's left represents the largest $Mg_2Si$ crystallized product shown in a photograph on the reader's right.

TABLE 3

| Aluminum frame material | | AlCuMg 10.5° | $Al_2CuMg$ 19.1° | $MgZn_2$ 22.1° | AlmFe 25.7° | $Mg_2Si$ 40.2° |
|---|---|---|---|---|---|---|
| iii | 1 | 7.5 | 1.3 | 9.6 | 1.2 | 2.5 |
|  | 2 | 7.8 | 2.0 | 8.3 | 1.3 | 3.0 |
|  | 3 | 6.3 | 2.2 | 9.5 | 1.4 | 3.0 |
|  | ave. | 7.2 | 1.8 | 9.1 | 1.3 | 2.8 |
|  | std. | 0.8 | 0.5 | 0.7 | 0.1 | 0.3 |
| i | 1 | 9.6 |  | 9.5 |  |  |
|  | 2 | 11.1 |  | 8.2 |  |  |
|  | 3 | 9.9 |  | 8.5 |  |  |
|  | ave. | 10.2 |  | 8.7 |  |  |
|  | std. | 0.8 |  | 0.7 |  |  |

As is apparent from the results of the X-ray diffraction shown in Table 3, of the Mg$_2$Si crystallized product, the AlCuMg crystallized product, the Al—Fe-based crystallized product (Al$_m$Fe or Al$_7$Cu$_2$Fe), and the Al$_2$CuMg crystallized product, all of those crystallized products were detected in the aluminum frame material iii, but only the AlCuMg crystallized product was detected in the aluminum frame material i. That is, it was confirmed that the Al$_m$Fe crystallized product, the Al$_2$CuMg crystallized product, and the Mg$_2$Si crystallized product were reduced in amount and size. It should be noted that Table 3 shows the results of the X-ray diffraction as a diffraction angle of a peak (2θ) representing respective phases and a value of integral diffraction intensity (unit: kcounts). The aluminum frame materials were each measured three times, and the three measured values, an average (ave.) and standard deviation (std.) thereof were shown as the results.

The measurement using an image analyzer as described above was performed on the respective aluminum frame materials in 58 pieces of cumulative fields. In the measurement, the maximum value and average value of the circle-equivalent diameter of the Mg$_2$Si crystallized product were determined, and the area ratio of the Mg$_2$Si crystallized product having a circle-equivalent diameter of 1 μm or more with respect to the total area of the cumulative fields was also determined. Table 4 shows the results. Similarly, the maximum value and average value of the circle-equivalent diameter of the AlCuMg crystallized product, Al—Fe-based crystallized product (Al$_m$Fe or Al$_7$Cu$_2$Fe), and Al$_2$CuMg crystallized product were determined, and the total area ratio of the AlCuMg crystallized product, Al—Fe-based crystallized product (Al$_m$Fe or Al$_7$Cu$_2$Fe), and Al$_2$CuMg crystallized product each having a circle-equivalent diameter of 1 μm or more with respect to the total area of the cumulative fields was also determined. Table 5 shows the results.

to anodic oxidation processing through electrolysis using as an electrolytic solution an alkaline aqueous solution (pH=13.0) having dissolved therein 53 g/L of sodium tartrate dihydrate (Na$_2$C$_4$H$_4$O$_6$.2H$_2$O) and 4 g/L of sodium hydroxide at a bath temperature of 5° C. and a constant electrolysis voltage of 40 V for 15 min. At this time, a dummy material was subjected to anodic oxidation to control the amount of dissolved Al in the electrolytic solution to 0.3 g/L. Then, after being washed with pure water, an anodic oxide film formed on the surface of the aluminum frame material was measured with an eddy current-type film thickness meter (manufactured by Fischer Instruments K.K.) and found to have a thickness of 5 μm.

Next, the aluminum frame material subjected to the anodic oxidation processing was put in an aqueous solution containing an organic dye (TAC411 manufactured by Okuno Chemical Industries Co., Ltd.) at a concentration of 10 g/L, and subjected to dyeing processing by being immersed therein at a temperature of 55° C. for 10 min. After the dyeing processing, the aluminum frame material was placed in a steam sealing device and subjected to sealing processing for 30 min while steam having a relative humidity of 100% (R.H.), a pressure of 2.0 kg/cm$^2$G, and a temperature of 130° C. was generated. Thus, a test pellicle frame according to Example 1 was obtained.

The test pellicle frame according to Example 1 was produced in 50 pieces in the same manner as described above. The 50 pieces of test pellicle frames were each visually observed under irradiation with fluorescent light and under irradiation with collected light at an illuminance of 300,000 lux (lx), and the number of test pellicle frames in which a white spot involving light reflection was generated was confirmed (even the case where one white spot was present was counted as one). Table 6 shows the results. No white spot was found in the visual observation under irra-

TABLE 4

| Aluminum frame material | Relationship between size of circle-equivalent diameter and number of grains of Mg$_2$Si crystallized product | | | | | | | Circle-equivalent diameter of Mg$_2$Si crystallized product (μm) | | Area ratio of Mg$_2$Si crystallized product of 1 μm or more (%) |
|---|---|---|---|---|---|---|---|---|---|---|
| | Exceeding 10 μm | Exceeding 9 μm | Exceeding 8 μm | Exceeding 7 μm | Exceeding 6 μm | Exceeding 5 μm | Exceeding 4 μm | Maximum value | Average value | |
| i | 0 | 0 | 0 | 0 | 3 | 3 | 4 | 6.8 | 1.2 | 0.05 |
| ii | 0 | 0 | 0 | 0 | 0 | 0 | 0 | 2.4 | 1.0 | 0.02 |
| iii | 0 | 2 | 3 | 5 | 7 | 10 | 12 | 9.5 | 1.3 | 0.10 |

TABLE 5

| Aluminum frame material | Relationship between size of circle-equivalent diameter and number of grains of AlCuMg crystallized product, Al-Fe-based crystallized product (Al$_m$Fe or Al$_7$Cu$_2$Fe), and Al$_2$CuMg crystallized product | | | | | | | Circle-equivalent diameter (μm) | | Area ratio of crystallized product of 1 μm or more (%) |
|---|---|---|---|---|---|---|---|---|---|---|
| | Exceeding 10 μm | Exceeding 9 μm | Exceeding 8 μm | Exceeding 7 μm | Exceeding 6 μm | Exceeding 5 μm | Exceeding 4 μm | Maximum value | Average value | |
| i | 0 | 0 | 3 | 6 | 10 | 15 | 26 | 8.7 | 0.9 | 0.12 |
| ii | 0 | 0 | 3 | 6 | 9 | 13 | 22 | 9.5 | 0.7 | 0.12 |
| iii | 2 | 3 | 17 | 21 | 53 | 104 | 207 | 10.3 | 1.6 | 0.86 |

Example 1

The obtained aluminum frame material i was subjected to shot blasting processing using stainless steel having an average grain diameter of about 100 μm, and then subjected diation with fluorescent light and under irradiation with collected light at an illuminance of 300,000 lx.

In addition, one test pellicle frame according to Example 1 was put into a polyethylene bag and the bag was sealed after 100 ml of pure water was added thereto. Then, the test pellicle frame was immersed therein for 4 hr while the temperature was kept at 80° C. After that, extraction water in which eluted components were extracted was analyzed with an ion chromatography analyzer (ICS-2000 manufactured by Dionex Corporation) under the conditions of a cell temperature of 35° C., a column (Ion Pac AS11-HC) temperature of 40° C., and 1.5 ml/min. An acetate ion, a formate ion, a hydrochloride ion, a nitrite ion, a nitrate ion, a sulfate ion, and an oxalate ion were detected from the extraction water, and the concentrations of those ions to be eluted in 100 ml of pure water per 100 cm² of the surface area of the pellicle frame were determined. The case where the concentration of a sulfate ion closely associated with haze was less than 0.005 ppm, which was a quantitative limit (lower limit) of the used ion chromatography analyzer, was represented by Symbol "◯" in haze evaluation. The case where the concentration of a sulfate ion was 0.005 ppm or more was represented by Symbol "x" in haze evaluation. Table 4 shows the results. The evaluation revealed that the generation of haze was suppressed in the test pellicle frame according to Example 1.

TABLE 6

| | Test pellicle frame | | | |
|---|---|---|---|---|
| | | Number of pellicle | | |
| | Electrolytic | frames in which a white | | |
| Aluminum | solution in anodic | spot is generated | | Haze |
| frame material | oxidation processing[1] | Fluorescent light | Collected light | evaluation |
| Example 1 | i | Na₂C₄H₄O₆ NaOH | 0 | 0 | ◯ |
| Example 2 | ii | Na₂C₄H₄O₆ NaOH | 0 | 0 | ◯ |
| Example 3 | i | Na₃C₆H₅O₇ NaOH | 0 | 0 | ◯ |
| Comparative Example 1 | iii | Na₂C₄H₄O₆ NaOH | 18 | 25 | ◯ |
| Comparative Example 2 | i | H₂SO₄ | 0 | 0 | x |
| Comparative Example 3 | ii | H₂SO₄ | 0 | 0 | x |
| Comparative Example 4 | iii | H₂SO₄ | 2 | 3 | x |

[1]"Na₂C₄H₄O₆" represents sodium tartrate dihydrate, and "Na₃C₆H₅O" represents sodium citrate dihydrate.

Example 2

A total of 50 pieces of test pellicle frames according to Example 2 were produced in the same manner as in Example 1 except that the aluminum frame material ii was used. The 50 pieces of test pellicle frames were each visually observed under irradiation with fluorescent light and under irradiation with collected light at an illuminance of 300,000 lux (lx), and the number of test pellicle frames in which a white spot involving light reflection was generated was confirmed. As a result, no white spot was observed in any of the test pellicle frames. In addition, the concentrations of the ions to be eluted in 100 ml of pure water per 100 cm² of the surface area of the pellicle frame were measured in the same manner as in Example 1, and the presence or absence of haze was evaluated. Table 6 summarizes the results.

Example 3

A total of 50 pieces of test pellicle frames according to Example 3 were produced in the same manner as in Example 1 except that an alkaline aqueous solution (pH=13.0) containing 120 g/L of sodium citrate dihydrate (Na₃C₆H₅O₇.2H₂O) and 4 g/L of sodium hydroxide was used as the electrolytic solution. The 50 pieces of test pellicle frames were each visually observed under irradiation with fluorescent light and under irradiation with collected light at an illuminance of 300,000 lux (lx), and the number of test pellicle frames in which a white spot involving light reflection was generated was confirmed. As a result, no white spot was observed in any of the test pellicle frames. In addition, the concentrations of the ions to be eluted in 100 ml of pure water per 100 cm² of the surface area of the pellicle frame were measured in the same manner as in Example 1, and the presence or absence of haze was evaluated. Table 6 summarizes the results.

Comparative Example 1

A total of 50 pieces of test pellicle frames according to Comparative Example 1 were produced in the same manner as in Example 1 except that the aluminum frame material iii was used. The 50 pieces of test pellicle frames were each visually observed under irradiation with fluorescent light and under irradiation with collected light at an illuminance of 300,000 lux (lx), and the number of test pellicle frames in which a white spot involving light reflection was generated was confirmed. As a result, white spots were observed in 18 pieces of the test pellicle frames under irradiation with fluorescent light and in 25 pieces of the test pellicle frames under irradiation with collected light. In addition, the concentrations of the ions to be eluted in 100 ml of pure water per 100 cm² of the surface area of the pellicle frame were measured in the same manner as in Example 1, and the presence or absence of haze was evaluated. The results were found to be the same as those obtained in Example 1.

Comparative Examples 2 to 4

In each of the cases of using the aluminum frame material i (Comparative Example 2), using the aluminum frame material ii (Comparative Example 3), and using the aluminum frame material iii (Comparative Example 4), a total of 50 pieces of test pellicle frames were produced in the same manner as in Example 1 except that 160 g/L of a sulfuric acid aqueous solution was used as the electrolytic solution and the electrolysis was performed at a bath temperature of 20° C. and a constant electrolysis voltage of 17 V for 19 min.

In the same manner as in Example 1, the obtained test pellicle frames according to Comparative Examples 2 to 4 were each visually observed under irradiation with fluorescent light and under irradiation with collected light at an illuminance of 300,000 lux (lx), and the number of test pellicle frames in which a white spot involving light reflection was generated was confirmed. As a result, it was found that no white spot was observed in any of the test pellicle frames of Comparative Examples 2 and 3. In contrast, in the test pellicle frames of Comparative Example 4, white spots were observed in two pieces of the test pellicle frames under irradiation with fluorescent light and in three pieces of the test pellicle frames under irradiation with collected light.

In addition, the concentrations of the ions to be eluted in 100 ml of pure water per 100 cm² of the surface area of the pellicle frame were measured in the same manner as in Example 1. As a result, it was confirmed that haze was highly likely to be generated in the pellicle frames of Comparative Examples 2 to 4.

INDUSTRIAL APPLICABILITY

A pellicle device using the pellicle frame of the present invention exhibits particularly excellent effects in an environment of exposure with high-energy light. In addition, the surface glittering defect of the pellicle frame falsely recognized as dust is reduced, and hence the pellicle device can be extremely preferably utilized in the field of manufacturing of a semiconductor device or the like in which thinning increasingly progresses in the future.

REFERENCE SIGNS LIST

1: hollow extruded profile
2: aluminum frame material
2a: cut surface of aluminum frame material

The invention claimed is:

1. A pellicle frame, comprising:
   an aluminum frame;
   an anodic oxide film formed on a surface of the aluminum frame, wherein
   the aluminum frame comprises an Al-Zn-Mg-based aluminum alloy having a structure, in which a $Mg_2Si$ crystallized product has a maximum circle-equivalent diameter of 7 μm or less, an area ratio of a $Mg_2Si$ crystallized product having a circle-equivalent diameter of 1 μm or more is less than 0.10%, an AlCuMg crystallized product, an Al-Fe-based crystallized product, and an $Al_2CuMg$ crystallized product each have a maximum circle-equivalent diameter of 9 μm or less, and a total area ratio of an AlCuMg crystallized product, an Al-Fe-based crystallized product, and an $Al_2CuMg$ crystallized product each having a circle-equivalent diameter of 1μm or more is less than 0.20%;
   the anodic oxide film is obtained through anodic oxidation processing using an alkaline electrolytic solution containing as an electrolyte any one kind or two or more kinds selected from the group consisting of dicarboxylic acid salts and tricarboxylic acid salts;
   the pellicle frame having less than 0.005 ppm of a concentration of a sulfate ion ($SO_4^{2-}$) in terms of concentration to be eluted in 100 ml of pure water per 100 $cm^2$ of a surface area of the pellicle frame;
   the aluminum frame is obtained by subjecting a DC cast billet to homogenization processing comprising heating and retaining the DC cast billet at a temperature of 460° C. or more for 12 hr or more in total; and
   the DC cast billet satisfies a JIS A7075 standard and comprises 0.30 mass % or less of Mn, 5.1 to 6.1 mass % of Zn, 0.25 mass % or less of total amount of Zr and Ti, 2.1 to 2.6 mass % of Mg, 1.2 to 1.6 mass % of Cu, 0.18 to 0.28 mass % of Cr, 0.07 mass % or less of Fe, 0.04 mass % or less of Si, and the balance of Al.

2. A pellicle frame according to claim 1, wherein the homogenization processing comprises: first homogenization processing comprising heating and retaining the DC cast billet at a temperature of 460° C. or more for 12 hr or more in total; and
   second homogenization processing comprising retaining the DC cast billet at a temperature higher than the temperature of the first homogenization processing for 1 hr or more in total.

3. A pellicle frame according to claim 1 or 2, wherein the anodic oxide film is dyed with a black dye.

* * * * *